(12) United States Patent
Miyagawa

(10) Patent No.: US 6,563,196 B2
(45) Date of Patent: May 13, 2003

(54) SEMICONDUCTOR WAFER, SEMICONDUCTOR DEVICE AND MANUFACTURING METHOD THEREFOR

(75) Inventor: Yuichi Miyagawa, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 09/916,837

(22) Filed: Jul. 26, 2001

(65) Prior Publication Data
US 2002/0038912 A1 Apr. 4, 2002

(30) Foreign Application Priority Data
Jul. 31, 2000 (JP) ......................................... 2000-230290

(51) Int. Cl.[7] ...................... H01L 23/544; H01L 23/48; H01L 23/52; H01L 23/40; H01L 23/29

(52) U.S. Cl. ...................... 257/620; 257/782; 257/791

(58) Field of Search ............................... 257/782, 791, 257/620; 438/113

(56) References Cited
FOREIGN PATENT DOCUMENTS
JP           62112348 A  *  5/1987  .................. 438/465

* cited by examiner

Primary Examiner—Amir Zarabian
Assistant Examiner—Kiesha Rose
(74) Attorney, Agent, or Firm—Choate, Hall & Stewart

(57) ABSTRACT

The invention aims to easily suppress chipping on the reverse face of a semiconductor when a semiconductor wafer is cut, and to make it possible to easily prevent edge contact of bonding wires. A resin film (14) is formed at the periphery of boundary regions (corresponding to 6) provided for chip separation of semiconductor chips (8). Then, the semiconductor wafer (1) is diced by cutting along the central part (corresponding to 7) of the boundary region. Furthermore, in a semiconductor device having semiconductor elements formed on a semiconductor substrate, the resin film (14) is formed on a part of the boundary regions provided for chip separation, matching the bonding pads (3) of each chip. Alternatively, the resin film (14) is formed with a predetermined width on the periphery of the abovementioned boundary regions. Additionally, the arrangement is such that the semiconductor substrate (9) and the abovementioned wires do not touch when bonding wires (16) are connected at the time of mounting the semiconductor chips.

15 Claims, 9 Drawing Sheets

PRIOR ART

SEMICONDUCTOR WAFER, SEMICONDUCTOR DEVICE AND MANUFACTURING METHOD THEREFOR

BACKGROUND OF THE INVENTION

1. Field of the Invention

The present invention relates to a semiconductor wafer, a semiconductor device and a manufacturing method therefor. In particular the invention relates to the structure of a dicing section of a semiconductor wafer, a dicing method for chip separation, and the structure of the edge section of a semiconductor device.

2. Description of the Related Art

Miniaturization of the structure of semiconductor elements such as insulated gate field effect transistors (hereunder referred to as MOS transistors) and the like is still advancing rapidly. Regarding miniaturization, semiconductor elements using dimensions around 0.1 $\mu$m through 0.2 $\mu$m are being researched currently, and ULSI semiconductor devices containing 16 Gb generation DRAM, super high-speed logic, or both, using these sizes as their design rules, are in research and development.

For high levels of integration, high speed, high performance, and additional multiple functions of semiconductor devices, high density semiconductor chip mounting techniques for mounting semiconductor devices play an important role, along with fine processing techniques for manufacturing the semiconductor devices. Especially in recent years, for use in portable equipment, it has been important to mount semiconductor chips using multi chip package (MCP) techniques, which contain two or more chips in one package, chip scale package (CSP) techniques or the like, and semiconductor integrated circuit (IC) miniaturization.

To develop the high density mounting techniques mentioned above, it is necessary to form a protective insulation film using a resin film on semiconductor wafers that contain semiconductor devices. At present therefore, a photosensitive resin film such as polyimide resin film is formed on the abovementioned semiconductor wafers.

Furthermore, such a resin film is recognized as having a role in preventing defects (chipping) on the surface of semiconductor chips in a process where semiconductor wafers are diced to separate the semiconductor chips.

Accordingly, the abovementioned resin film for protecting semiconductor chips is formed such that it coats the whole surface of the dicing section (dicing street) of the semiconductor wafer, and the semiconductor wafer is cut by a diamond blade along this dicing street. For example, this technique is described in Japanese Unexamined Patent Application First Publication No. 62-063446 and Japanese Unexamined Patent Application First Publication No. 62-112348.

Hereunder is a description of the conventional technique, with reference to the figures. FIG. 8 is a partial plan view of a semiconductor wafer. Here, the edge sections of four chips are shown. Furthermore for clarity, diagonal lines are drawn on the resin films coating the semiconductor wafer.

As shown in FIG. 8, semiconductor element regions 102, 102a, 102b, and 102c, being semiconductor chips, are formed on a semiconductor wafer 101. Here, bonding pads 103 are formed on the edge section of each semiconductor element region. A resin film 105 is formed over the whole surface, except at openings 104 provided on the bonding pads 103. Here, a dicing street 106, being a boundary region provided for chip separation, is formed with a predetermined width between the semiconductor element regions 102, 102a, 102b and 102c, and the resin film is formed coating the whole surface of this dicing street 109.

In the case where the semiconductor wafer is diced to form semiconductor chips, the semiconductor wafer is cut by a diamond blade along a separation line 107 shown by dashed lines in FIG. 8. Here, the diamond blade is applied on top of the resin film covering the dicing street 106, and the semiconductor wafer is cut through this resin film.

However, the conventional technique described above is known to have the following problems. If the resin film 105 is formed on the dicing street 106, it will certainly reduce chipping in the semiconductor wafer cutting process. However, when the present inventor performed a detailed examination of the semiconductor chips after the semiconductor wafer had been cut, it was seen that considerable chipping could occur easily on the reverse side of the semiconductor chips.

Normally, after finishing the first half of a semiconductor device manufacturing process (diffusion process), the reverse face of the semiconductor wafer is ground to a thickness of a little under 300 $\mu$m. After the above treatment, the semiconductor wafer is diced. The semiconductor wafer of a semiconductor integrated circuit (IC) that has high performance or multiple functions has a lower thickness after grinding. As a result, when manufacturing the abovementioned leading edge semiconductor integrated circuits (IC), chipping on the reverse face of the semiconductor chips after cutting as mentioned above easily causes problems such as poor contact with jigs in the semiconductor chip mounting process (part of the latter half of the process), for example a die bonding process. Such problems are even more acute in mounting of the abovementioned MCP.

Therefore, to solve the abovementioned problem of the conventional technique, as shown in FIG. 9(a), a method is proposed in that a resin film 105a is formed in the semiconductor element regions 102, 102a, 102b, and 102c, and the one on the dicing street 106 is removed. The semiconductor wafer is then cut along the separation line 107 to form semiconductor chips.

However, in this case, as shown in FIG. 9(b), a big problem occurs in the connection of bonding wires when mounting the semiconductor chips formed by cutting the semiconductor wafer. To describe an outline of a semiconductor chip 108 as shown in FIG. 9(b): an inorganic insulation film 110 is formed on a semiconductor substrate 109 on which semiconductor elements are formed, bonding pads 103 are formed on its upper section, and a resin film 105a with openings 104 is formed on the top. A bonding wire 112 is connected between a tape substrate or a stitch 111 mounted on the substrate and the bonding pad 103. However, this bonding wire 112 can bend easily and become a deformed wire 113, which causes it to make contact with the edge of the semiconductor chip 108. Here, in the method described in FIG. 9(a), since the surface of the semiconductor substrate 109 is exposed on the dicing street 106, the bonding wire 112 causes a short-circuit to the semiconductor substrate 109, which prevents the semiconductor device from operating. That is to say, edge contact of the bonding wire occurs easily, and defective semiconductor integrated circuits (IC) are likely to be produced frequently.

SUMMARY OF THE INVENTION

An object of the present invention is to suppress chipping on the reverse face of semiconductor chips during semiconductor wafer dicing. Another object of the present invention is to make it possible to easily prevent the abovementioned edge contact.

Therefore, a semiconductor wafer of the present invention has a plurality of semiconductor chips and boundary regions provided for chip separation, wherein a resin film pattern is formed on a part of the boundary regions matching bonding pads of each chip. Alternatively, a semiconductor wafer of the present invention has a plurality of semiconductor chips and boundary regions provided for chip separation, wherein a resin film pattern is formed with a predetermined width on the periphery of the boundary regions.

Furthermore, in a semiconductor device manufacturing method of the present invention, a resin film is coated onto the periphery of boundary regions provided for chip separation on a semiconductor wafer, and the semiconductor wafer is cut along the central part of the boundary regions. Here the width of the periphery of the boundary regions is greater than 10 $\mu$m.

Furthermore, in a semiconductor device of the present invention, wherein semiconductor elements are formed on a semiconductor substrate, a resin film pattern is formed matching bonding pads of each chip on a part of the boundary regions provided for chip separation. Alternatively, in a semiconductor device having semiconductor elements formed on the semiconductor substrate, a resin film pattern is formed with a predetermined width on the periphery of boundary regions provided for chip separation.

The width of the resin film pattern is set to be greater than 10 $\mu$m. Alternatively, the thickness of the resin film pattern is set to be greater than or equal to 0.1 $\mu$m.

In the present invention, a resin film is formed on the periphery of the boundary regions provided for chip separation of semiconductor chips. Therefore, when the semiconductor wafer is diced, chipping on the reverse face of the semiconductor chips formed is reduced considerably. Furthermore, when connecting bonding wires while mounting the semiconductor chips formed by cutting the semiconductor wafer, the abovementioned edge contact problem does not occur at all. In this manner, the yield of the semiconductor chip mounting process is increased considerably.

DETAILED DESCRIPTION OF THE INVENTION

Figure 1:
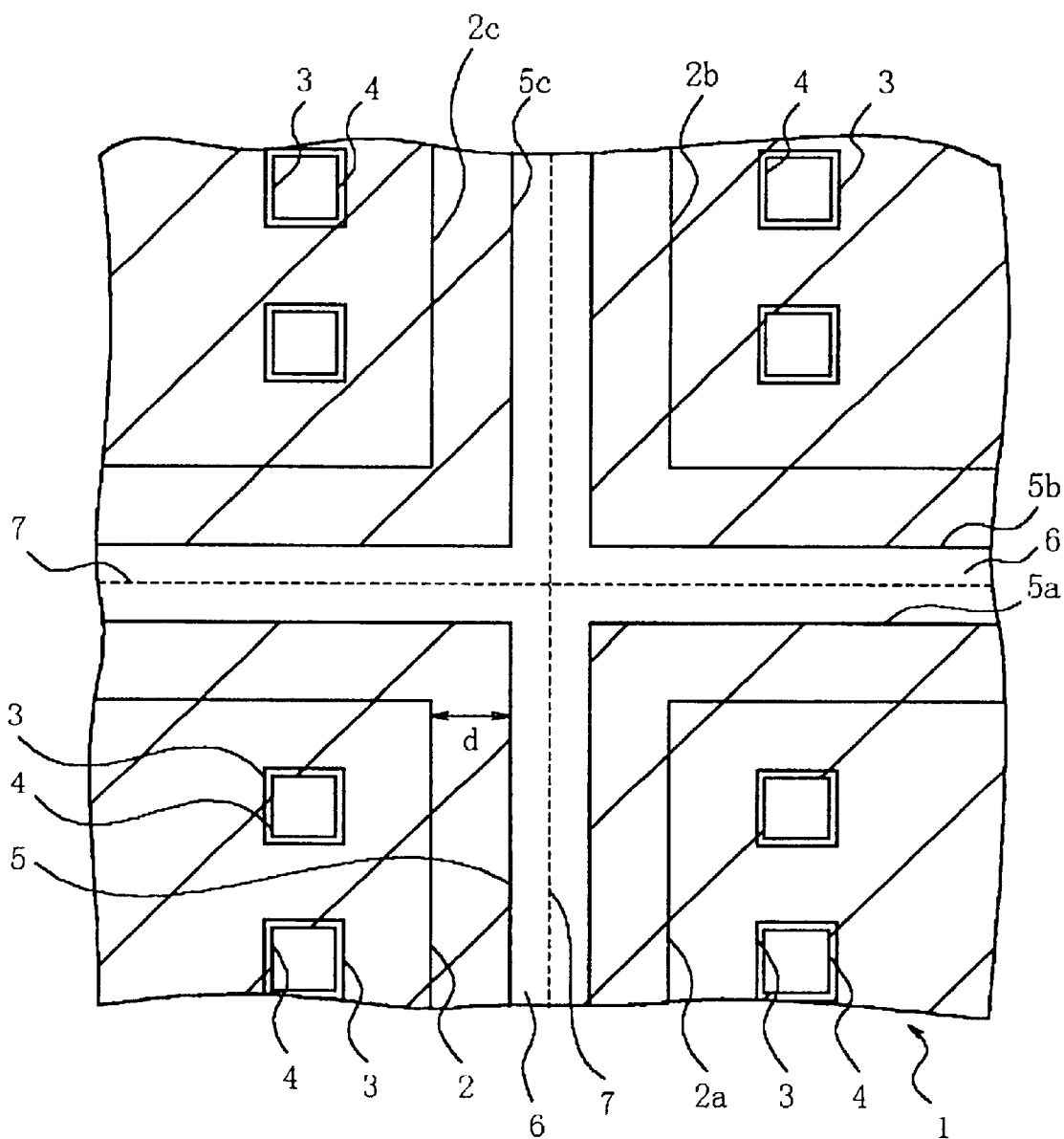
FIG. 1 is a plan view of a semiconductor wafer to explain a first embodiment of the present invention.
Figure 8:
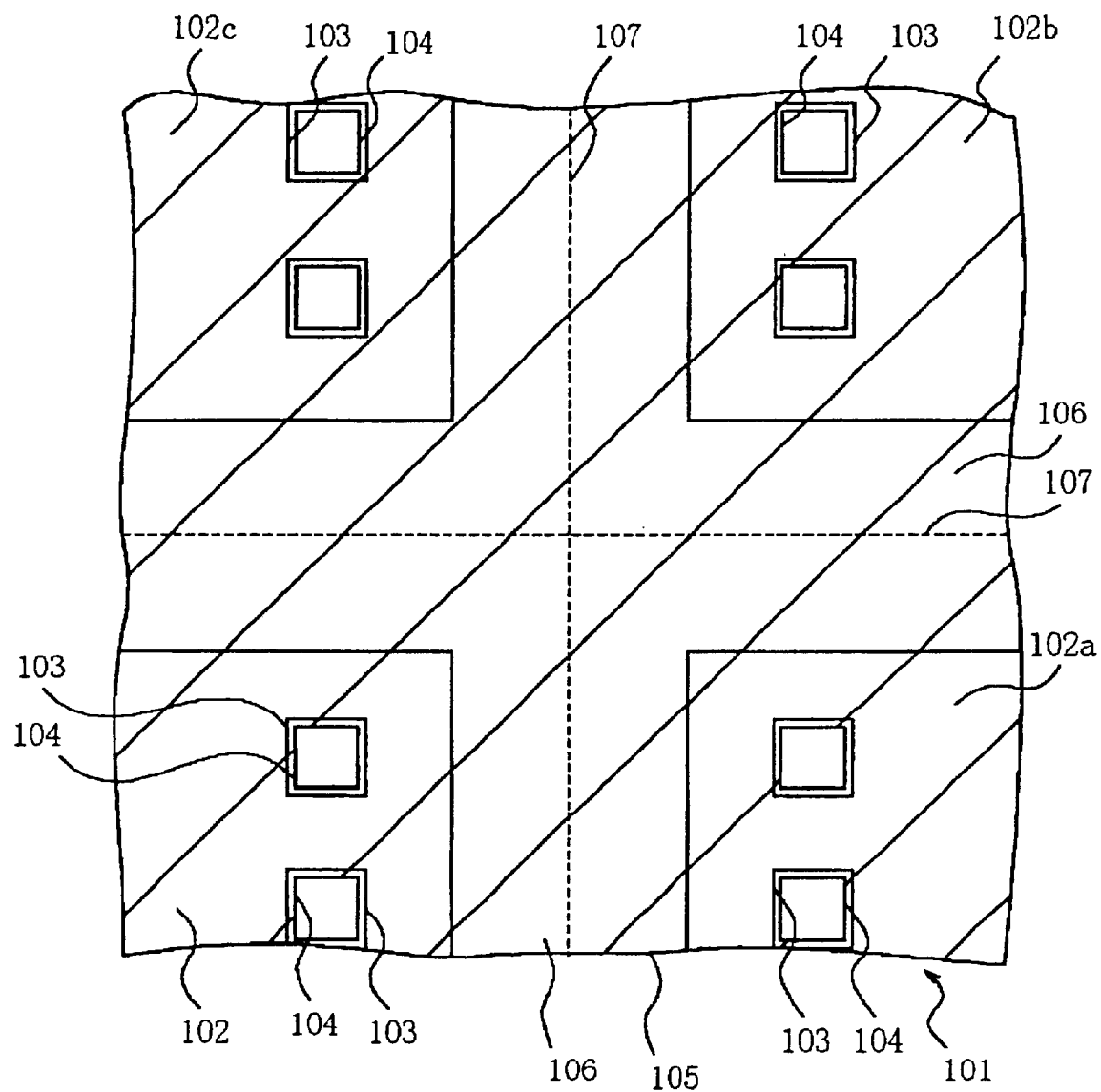
FIG. 8 is a plan view of a semiconductor wafer to explain a conventional technique.
Figure 9A:
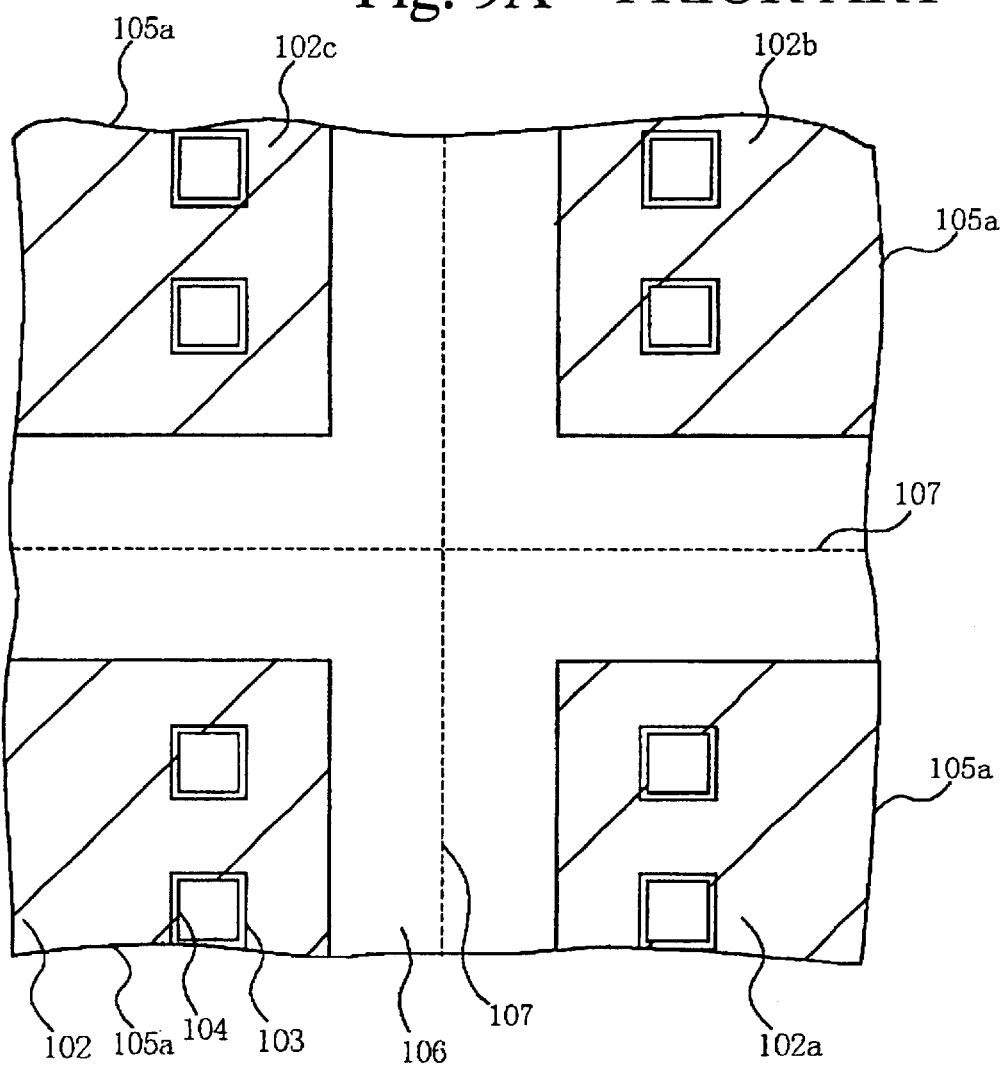
FIGS. 9A and 9B are plan views of a semiconductor wafer to explain the conventional technique, and a sectional view to explain the mounting of semiconductor chips.
Figure 9B:
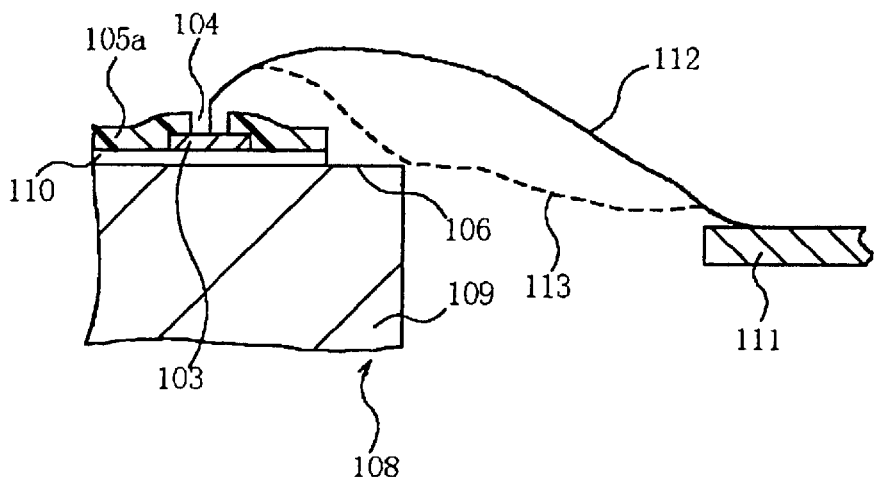

Next is a description of a first embodiment based on FIG. 1 and FIG. 2. FIG. 1 is a plan view of part of a semiconductor wafer. Here, similarly to the description of FIG. 8, the edge sections of four chips are shown. Furthermore, hatched lines are drawn on a resin film coating the semiconductor wafer for clarity.

As shown in FIG. 1, semiconductor element regions 2, 2a, 2b and 2c, being semiconductor chips, are formed on a semiconductor wafer 1. Bonding pads 3 are formed at the edge of each semiconductor element region. Resin films 5, 5a, 5b and 5c, being resin film patterns, coat the semiconductor element regions 2, 2a, 2b and 2c respectively, but avoid covering the openings 4 provided on each bonding pad 3 and the central region of a bonding street 6, being a boundary region provided for chip separation. Here, it is important to control the amount of each resin film that extends from the semiconductor element region to the bonding street 6 region, that is, an overlap amount d shown in FIG. 1. This will be described later. Here, the resin films 5, 5a, 5b and 5c comprise photosensitive resins such as polyimide resins and the like.

In the case where the abovementioned semiconductor wafer is diced to form semiconductor chips, it is cut by a diamond blade along separation lines 7 shown by dashed lines in FIG. 1. Here, the diamond blade is applied to the exposed semiconductor substrate of the semiconductor wafer 1. Here, the diamond blade does not touch the resin film as in the conventional technique. In the conventional technique, resin films such as polyimide and the like adhere to the diamond blade, which reduces cutting ability. Therefore, it is necessary to apply a lot of power to the blade at the time of cutting. However, in the present invention there is no adherence as mentioned above, so that the force that the blade applies to the semiconductor substrate at the time of cutting is reduced. As a result, the amount of chipping in the present invention is reduced as mentioned later.

Figure 2A:
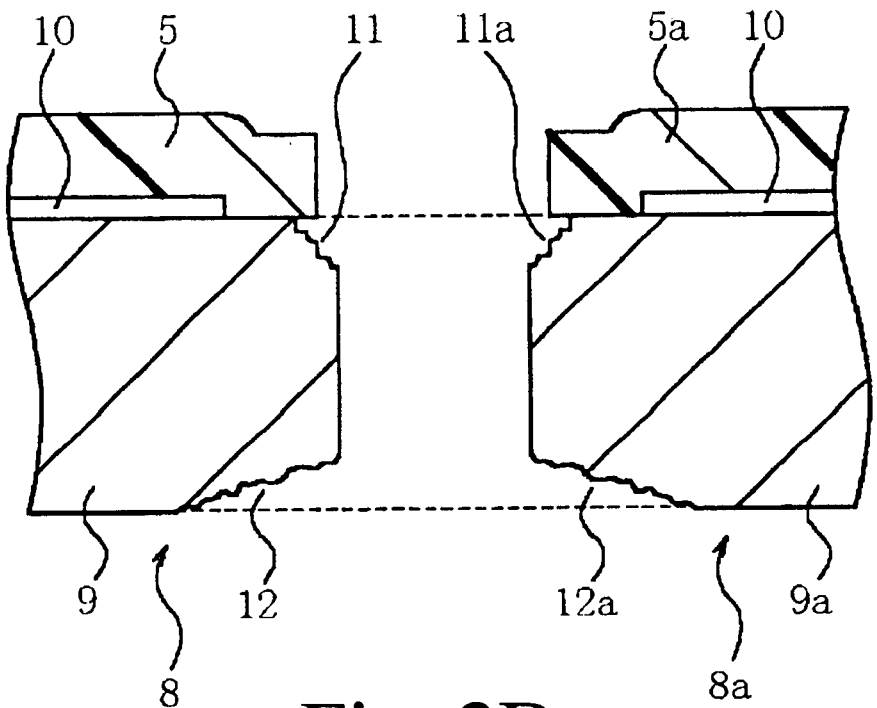
FIGS. 2A and 2B are cross-sectional views after the semiconductor wafer is cut explaining the effects of the present invention.
Figure 2B:
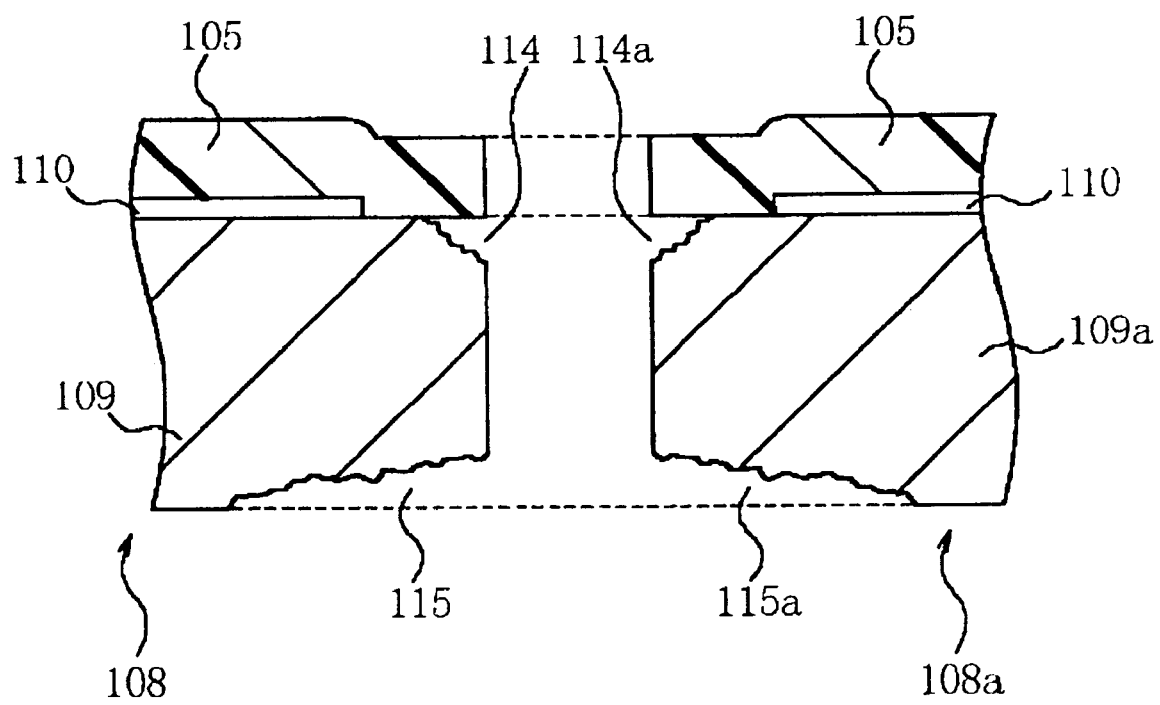

Next is a description of the effects of the embodiment with reference to FIG. 2 and Table 1. Here, FIG. 2(a) is a case of the present invention, and FIG. 2(b) is a case of the conventional technique described in FIG. 8.

As shown in FIG. 2(a), in the case of the present invention, semiconductor chips 8 and 8a are formed by dicing. Here, an inorganic insulation film 10 is formed on semiconductor substrates 9 and 9a shown by the dashed line in FIG. 2(a), and resin films 5 and 5a are formed on the tops respectively. The abovementioned cutting causes surface chipping 11 and 11a to occur at the edge of the surface side of the semiconductor chips 8 and 8a, and reverse face chipping 12 and 12a to occur on the reverse side.

Similarly, as shown in FIG. 2(b), in the case of the conventional method, semiconductor chips 108 and 108a are formed by dicing. Here, resin film 105, being the region shown by dashed lines in FIG. 2(b), and the semiconductor wafer 101 are cut through. An inorganic insulation film 110 is formed on semiconductor substrates 109 and 109a, and the resin film 105 is cut and formed on the top. The cutting causes surface chipping 114 and 114a to occur at the edge of the surface side of the semiconductor chips 108 and 108a, and reverse face chipping 115 and 115a to occur on the reverse side.

The degree of this chipping is described by Table 1. As shown in Table 1, in the case of the present invention, the length of the reverse face chipping 12 and 12a is reduced considerably and is less than or equal to one tenth of the reverse face chipping 115 and 115a in the case of the conventional method. Here, the chipping length is the length that the chipping extends from the edge of the semiconductor chip to inside of the semiconductor element region.

TABLE 1

|  | Present invention (chipping length) | Conventional method (chipping length) |
|---|---|---|
| Semiconductor chip surface | 5 to 10 μm | 5 to 10 μm |
| Semiconductor chip reverse face | to 15 μm | 150 to 200 μm |

To describe in more detail, in the case of the present invention the chipping length is 5 to 10 μm on the surface of the semiconductor chip as shown in Table 1. Moreover, in the case of the conventional method, the chipping length is 5 to 10 μm on the surface of the semiconductor chip, which is the same as in the present invention. This indicates that in the present invention, it is preferable for the overlap amount d of the resin films 5, 5a, 5b and 5c from the edge of the semiconductor element regions to the dicing street 6 region to be a value greater than 10 μm. This is because the length of the surface chipping 11 and 11a is 10 μm or less as described above, and if the overlap amount d exceeds this value, then the surface chipping does not reach the semiconductor element regions, so that there is no effect on the semiconductor elements at all.

On the other hand, on the reverse face, the length of the reverse chipping in the case of the present invention is 15 μm or less. While in the case of the conventional method, the length of the reverse chipping reaches 150 μm to 200 μm.

This drastic reduction in the reverse chipping, considerably reduces poor contact with the jig during die bonding in the semiconductor chip mounting process when manufacturing the aforementioned leading edge semiconductor integrated circuits (IC).

Next is a description of a second embodiment of the present invention based on FIG. 3 through FIG. 6. In this second embodiment, a method of easily avoiding the aforementioned edge contact problem of semiconductor chips is described. FIG. 3(a) and FIG. 4 through FIG. 6 are plan views of parts of a semiconductor wafer. Here, for simplicity, the edge sections of two chips are shown. Furthermore, hatched lines are drawn on the resin films coating the semiconductor wafer for clarity. FIG. 3(b) is a sectional view of a semiconductor chip that is connected to a mounting jig by a bonding wire after the semiconductor wafer of FIG. 3(a) has been cut. Here, the same items as shown in the first embodiment are designated by the same symbols.

Figure 3A:
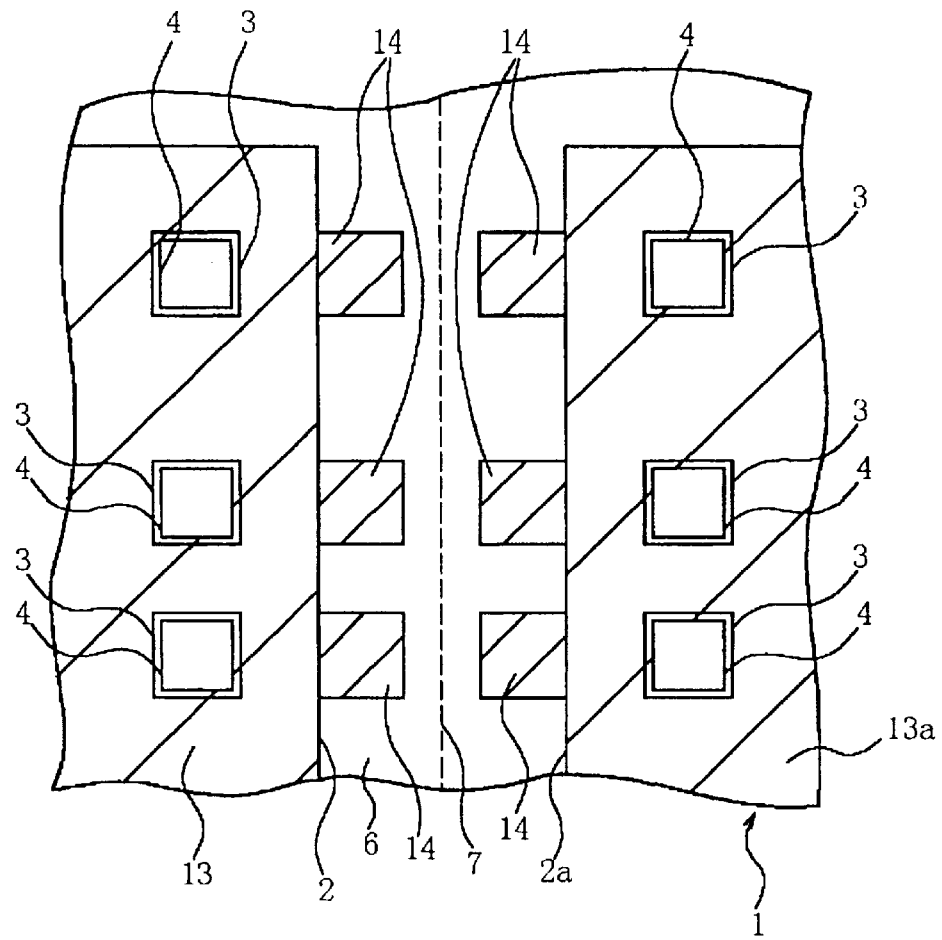
FIG. 3A is a plan views of a semiconductor wafer explaining a second embodiment of the present invention.

As shown in FIG. 3(a), the semiconductor element regions 2 and 2a are formed on the semiconductor wafer 1. The bonding pad 3 is formed on the edge section of each semiconductor element region. Resin films 13 and 13a coat the semiconductor element regions 2 and 2a, respectively, but avoid covering the opening 4 provided on each bonding pad 3.

Edge contact prevention films, being resin film patterns, are formed in the dicing street 6 region, each corresponding to a bonding pad 3 mentioned above. Here, the abovementioned resin films 13, 13a and the edge contact prevention films 14 comprise photosensitive polyimide resin film.

In the case where the abovementioned semiconductor wafer is diced to form semiconductor chips, it is cut by a diamond blade along a separation line 7 shown by a dashed line in FIG. 3(a). Here, the diamond blade is applied to the exposed semiconductor substrate of the semiconductor wafer 1. Here, the diamond blade does not touch the resin film as in the conventional technique. Therefore, as mentioned in the first embodiment, the amount of chipping of the semiconductor chip is reduced.

Figure 3B:
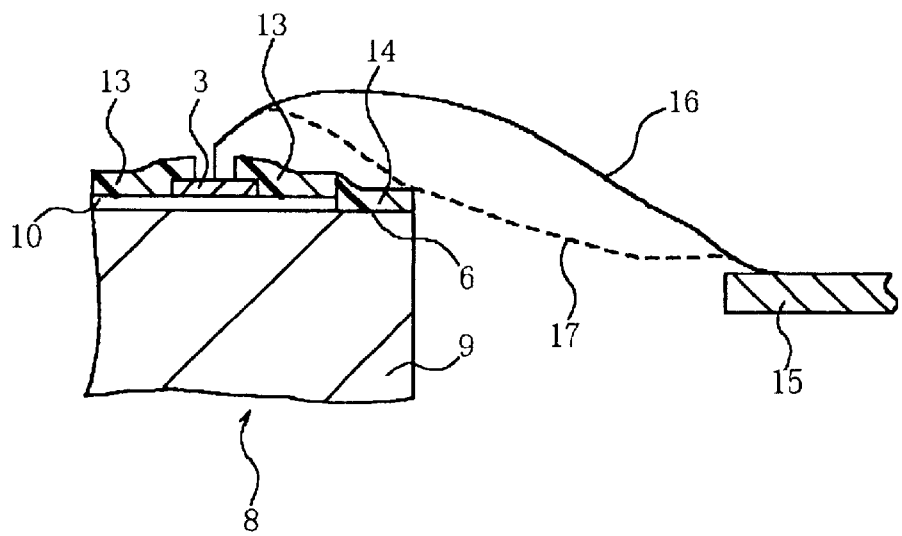
FIG. 3B is a cross-sectional view explaining the mounting of semiconductor chips.

In the case of this second embodiment as shown in FIG. 3(b), when connecting bonding wires while mounting the semiconductor chips formed by cutting the semiconductor wafer mentioned above, the edge contact problem does not occur at all. This will be described with reference to FIG. 3(b).

To describe an outline of a semiconductor chip 8 as shown in FIG. 3(b): an inorganic insulation film 10 is formed on a semiconductor substrate 9 on which semiconductor elements are formed, bonding pads 3 are formed on its upper section, and a resin film 13 with openings 4 is formed on the top. A bonding wire 16 is connected between a stitch 15 connected to the external terminal of a mounting jig and the bonding pad 3. Here, as described in the conventional technique, the bonding wire 16 can bend easily and become a deformed wire 17, which causes it to make contact with the edge of the semiconductor chip 108.

However, in the present invention, as shown FIG. 3(a) and FIG. 3(b), the edge contact prevention film 14 is formed in a part of the dicing street 6 region, facing the bonding pad 3. Here, as shown in FIG. 3(b), the edge contact prevention film 14 is formed such that it is integrated with the resin film 13. Since this edge contact prevention film 14 isolates the deformed wire 17 and the semiconductor substrate 9, the short circuit in the case of the conventional technique mentioned above never occurs, so that there is no defective semiconductor integrated circuit (IC) product. It is confirmed that the thickness of this edge contact prevention film 14 may be 0.1 μm or more.

In the second embodiment, several variations can be considered for the shape of the edge contact prevention film 14 pattern as shown in FIG. 3(a). Shapes of this resin film pattern will be described with reference to FIG. 4 through FIG. 6. The descriptions of the following figures concentrate mainly on the edge contact prevention film. Note that the parts that are not described are the same as described in FIG. 3(a).

Figure 4:
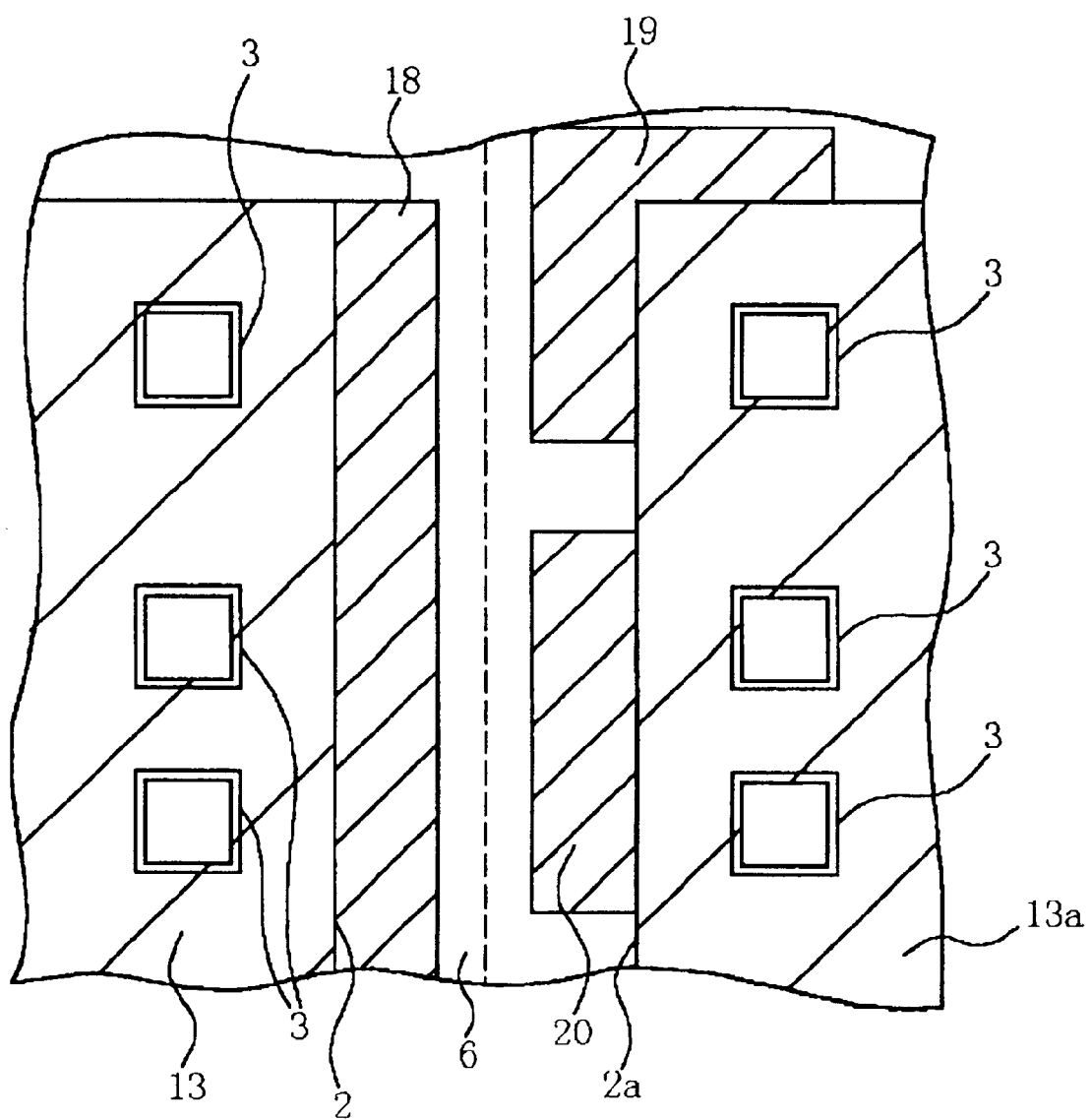
FIG. 4 is a plan view of another semiconductor wafer to explain a second embodiment of the present invention.

As shown in FIG. 4, the semiconductor element regions 2 and 2a are formed, and the bonding pads 3 are formed at the edge sections of each semiconductor element region. The resin films 13 and 13a coat the semiconductor element regions 2 and 2a respectively, but avoid the openings 4 provided on each of the bonding pads 3.

One edge contact prevention film 18 is formed in the dicing street 6 region, alongside all the bonding pads 3 on the semiconductor element region 2. Furthermore, edge contact prevention films 19 and 20 are formed alongside the bonding pads 3 in the semiconductor element region 2a.

Figure 5:
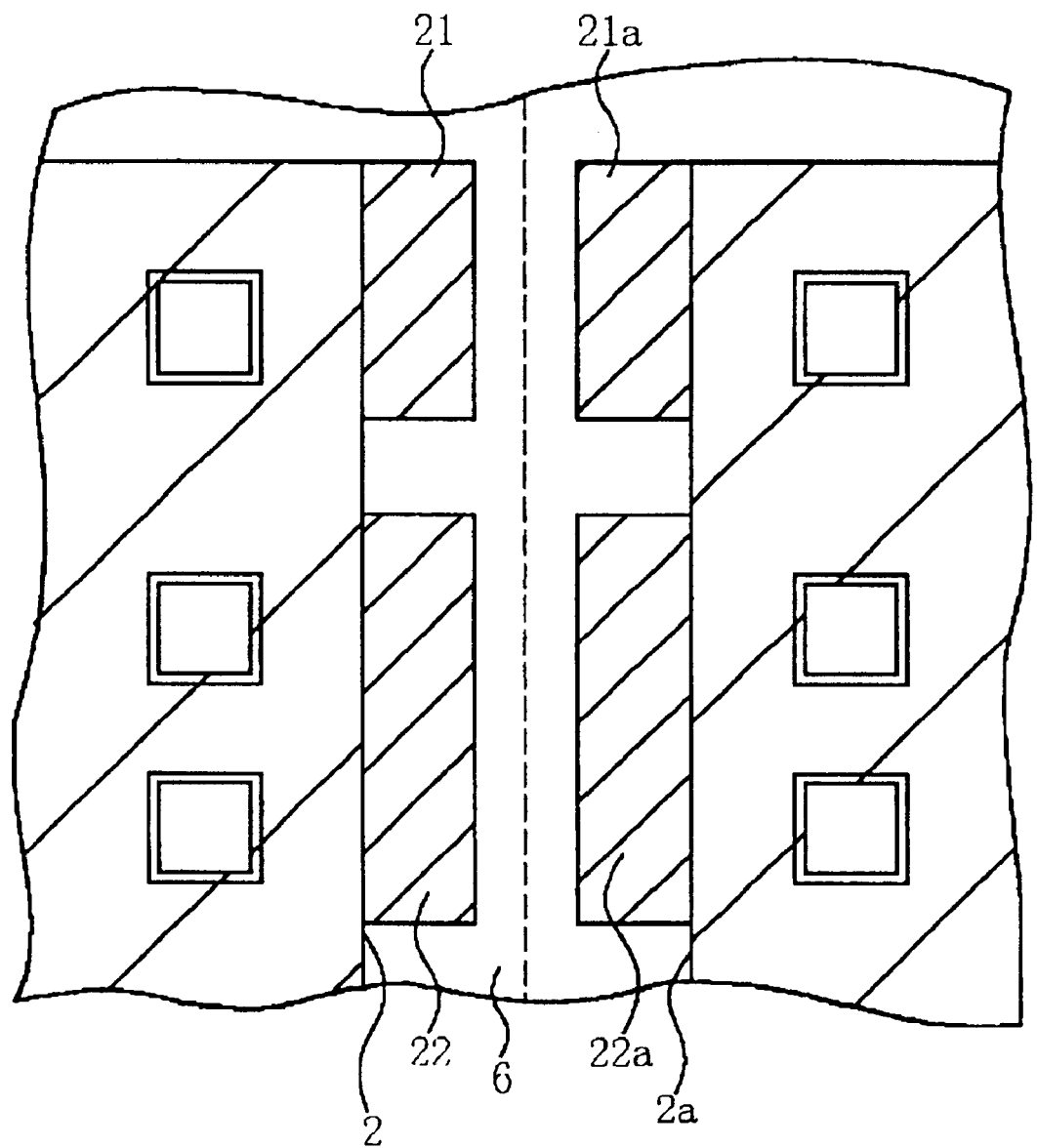
FIG. 5 is a plan view of another semiconductor wafer to explain the second embodiment of the present invention.

In FIG. 5, edge contact prevention films 21, 22, 21a and 22a are formed in the dicing street 6 region, alongside the bonding pads in the semiconductor element regions 2 and 2a.

Figure 6:
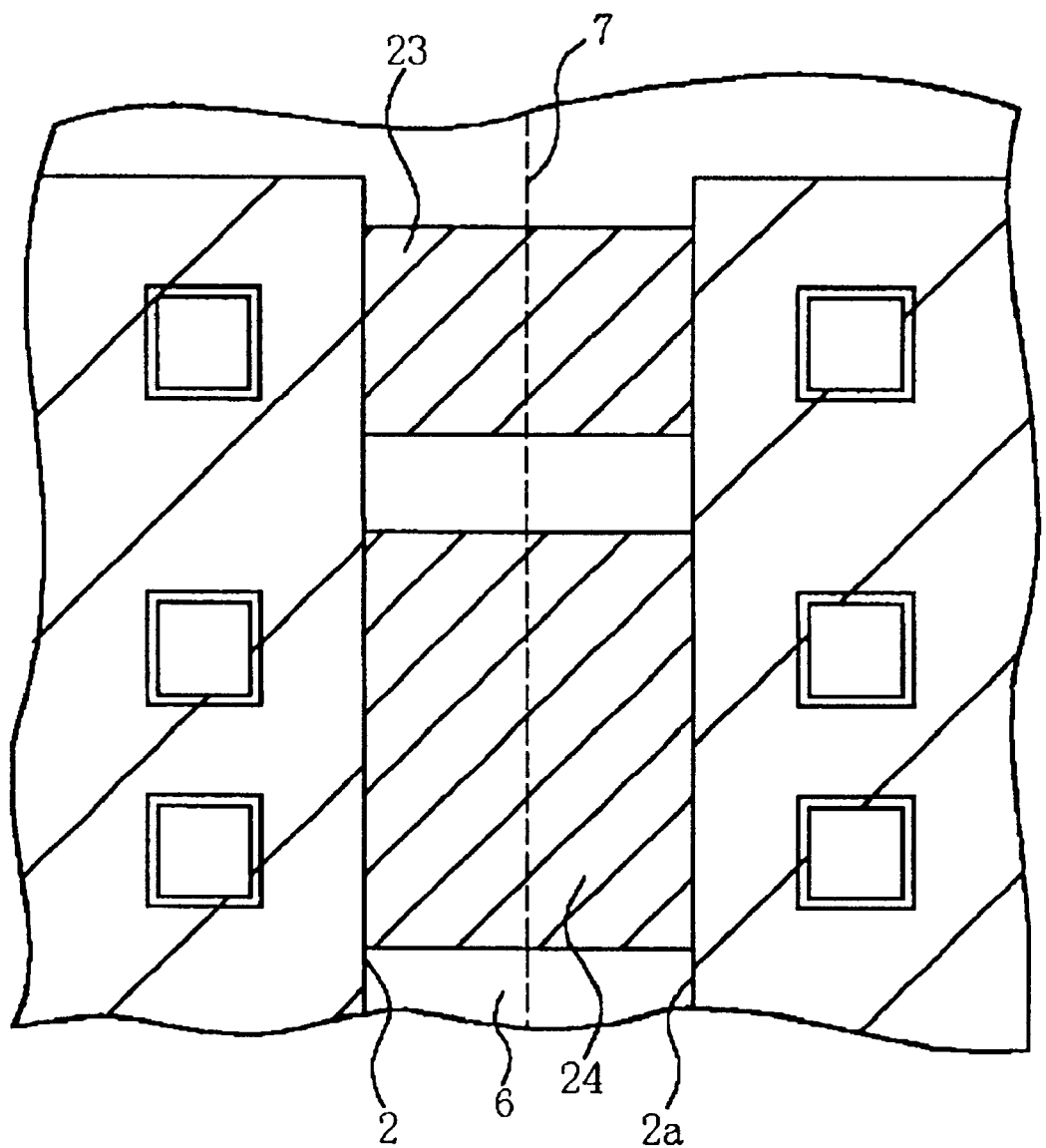
FIG. 6 is a plan view of another semiconductor wafer to explain the second embodiment of the present invention.

As shown in FIG. 6, edge contact prevention films 23 and 24 are formed in the dicing street 6 region, alongside the bonding pads in the semiconductor element regions 2 and 2a.

In the case where the abovementioned semiconductor wafer is diced to form semiconductor chips, it is cut by a diamond blade along a separation line 7 shown by a dashed line in FIG. 6. Here, the diamond blade also touches the edge contact prevention films 23 and 24, and cuts these regions. However, in this case, there are regions that are not covered by the edge contact prevention films. Since the diamond blade touches the semiconductor substrate surface in the regions that are not covered by the edge contact prevention films mentioned above, it is refreshed in those regions. As a result, even if the resin film adheres to the blade, it is removed. In this case, the occurrence of reverse face chipping is also less than that in the case of the conventional technique.

Figure 7:
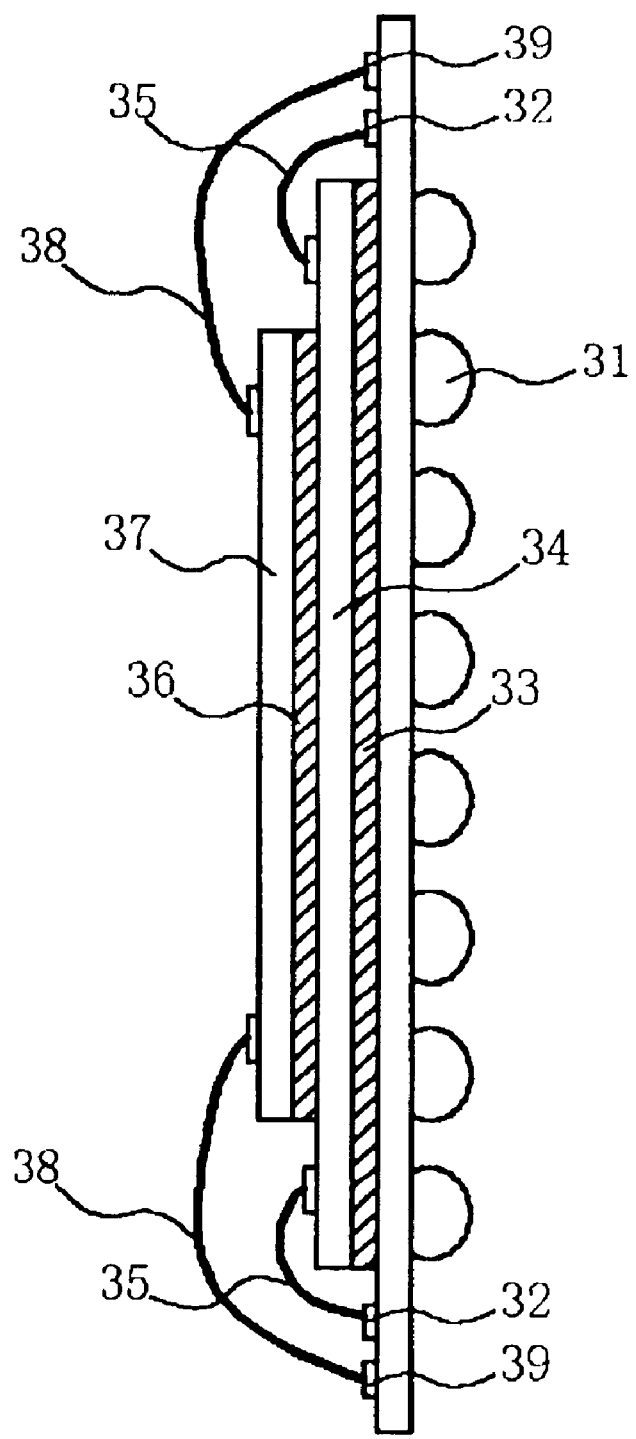
FIG. 7 is a schematic sectional view of an MCP in which semiconductor chips are mounted.

The method described in the second embodiment has a great effect on the MCP mounting technique. An example of the case of MCP mounting as mentioned above will be described with reference to FIG. 7. As shown in FIG. 7, a first wiring layer 32 is formed on the substrate and connected to external package terminals 31. A first semiconductor chip 34 to be connected to the substrate is formed by a first thermo compression bonding sheet 33, and the bonding pads of this first semiconductor chip 34 are electrically connected with the first wiring layer 32 by first wires 35 being bonding wires.

Furthermore, a second semiconductor chip 37 is bonded onto the first semiconductor chip 34 through a second thermo compression bonding sheet 36. Then, the bonding pads of the second semiconductor chip 37 are electrically connected to a second wiring layer 39 by second wires 38 being bonding wires. Here, for example, SRAM is formed on the first semiconductor chip 34, and flash memory is formed on the second semiconductor chip 37. In this manner, a semiconductor integrated circuit (IC) with a new function is created.

In such a MCP, the bonding wires are long. In the case shown in FIG. 7, the second wires 38 that are used for the connection of the second semiconductor chip 37 are much longer than normal. Therefore, the wire bends easily as mentioned above, and edge contact by a deformed wire with the second semiconductor chip 37 is likely to occur. Edge contact also occurs with the first semiconductor chip 34.

Here, if the method of the present invention is applied to these semiconductor chips, especially the second semiconductor chip 37, no short circuit occurs between the first wire 38 and the second semiconductor chip 37 because of the abovementioned edge contact prevention film.

In the present invention, a resin film is formed at the periphery of boundary regions provided for chip separation of semiconductor chips. Then, the semiconductor wafer is diced by cutting along the central part of the boundary regions. As a result, chipping on the reverse face of the semiconductor chips caused by the dicing is considerably reduced.

Furthermore, in a semiconductor device having semiconductor elements formed on the semiconductor substrate, a resin film pattern is formed on a part of the boundary regions provided for chip separation, matching the bonding pads of each chip. Alternatively, a resin film pattern is formed with a predetermined width along the boundary regions. As a result, when connecting bonding wires while mounting the semiconductor chips formed by cutting the semiconductor wafer, the edge contact problem, wherein the semiconductor substrate and the abovementioned wires touch, does not occur at all.

In this manner, the yield of the semiconductor chip mounting process is improved considerably. The present invention aids super high integration and high densification of semiconductor devices by high-density packaging.

What is claimed is:

1. A semiconductor wafer comprising a plurality of semiconductor chips and boundary regions provided for chip separation, wherein a resin film pattern is formed on only a part of said boundary regions matching bonding pads of each chip.

2. A semiconductor wafer comprising a plurality of semiconductor chips and boundary regions provided for chip separation, wherein a resin film pattern is formed with a predetermined width on the periphery of said boundary regions without completely covering said boundary regions.

3. A semiconductor wafer according to claim 2, wherein the width of said resin film pattern is set to be greater than 10 $\mu$m.

4. A semiconductor device having semiconductor elements formed on a semiconductor substrate, wherein a resin film pattern is formed matching bonding pads of each chip on a part of boundary regions provided for chip separation without completely covering said boundary regions.

5. A semiconductor device having semiconductor elements formed on a semiconductor substrate, wherein a resin film pattern is formed with a predetermined width on the periphery of boundary regions provided for chip separation without completely covering said boundary regions.

6. A semiconductor device according to claim 5, wherein the width of said resin film pattern is set to be greater than 10 $\mu$m.

7. A semiconductor device according to claim 4, wherein the thickness of said resin film pattern is set to be greater than or equal to 0.1 $\mu$m.

8. The semiconductor wafer of claim 1, wherein a first contiguous portion of said resin film pattern matches a plurality of consecutive bonding pads.

9. The semiconductor wafer of claim 8 wherein said first contiguous portion of said resin film does not cover a dicing line included in said boundary regions, said dicing line serving as a line along which said semiconductor wafer is cut.

10. The semiconductor wafer of claim 8, wherein said first contiguous portion of said resin film covers a dicing line included in said boundary regions, said dicing line serving as a line along which said semiconductor wafer is cut.

11. The semiconductor wafer of claim 8, wherein a second contiguous portion of said resin film matches a single bonding pad.

12. The semiconductor wafer of claim 11, wherein said second contiguous portion of said resin film does not cover a dicing line included in said boundary regions, said dicing line serving as a line along which said semiconductor wafer is cut.

13. The semiconductor wafer of claim 11, wherein said second contiguous portion of said resin film covers a dicing line included in said boundary regions, said dicing line serving as a line along which said semiconductor wafer is cut.

14. The semiconductor wafer of claim 1, wherein said resin pattern does not cover a dicing line included in said boundary regions, said dicing line serving as a line along which said semiconductor wafer is cut.

15. The semiconductor wafer of claim 1, wherein said resin pattern partially covers a portion of a dicing ling included in said boundary regions, said dicing line serving as a line along which said semiconductor wafer is cut.

* * * * *